United States Patent
Jeddeloh

(10) Patent No.: US 7,200,693 B2
(45) Date of Patent: Apr. 3, 2007

(54) MEMORY SYSTEM AND METHOD HAVING UNIDIRECTIONAL DATA BUSES

(75) Inventor: Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 10/928,411

(22) Filed: Aug. 27, 2004

(65) Prior Publication Data

US 2006/0047887 A1    Mar. 2, 2006

(51) Int. Cl.
*G06F 13/28* (2006.01)

(52) U.S. Cl. .......................... 710/22; 710/27; 710/52; 711/168

(58) Field of Classification Search ............ 710/21–23, 710/26, 27, 29, 52, 300; 711/105, 168
See application file for complete search history.

(56) References Cited

U.S. PATENT DOCUMENTS

| | | |
|---|---|---|
| 4,208,715 A | 6/1980 | Kumahara et al. |
| 4,503,497 A | 3/1985 | Krygowski et al. |
| 4,831,522 A | 5/1989 | Henderson et al. |
| 4,954,992 A | 9/1990 | Kumanoya et al. |
| 5,003,485 A | 3/1991 | Francisco |
| 5,202,856 A | 4/1993 | Glider et al. |
| 5,278,957 A | 1/1994 | Chan |
| 5,289,431 A | 2/1994 | Konishi |
| 5,369,619 A | 11/1994 | Ohba |
| 5,375,089 A * | 12/1994 | Lo .......................... 365/189.04 |
| 5,384,745 A | 1/1995 | Konishi et al. |
| 5,517,462 A | 5/1996 | Iwamoto et al. |
| 5,539,691 A | 7/1996 | Kozaru et al. |
| 5,597,084 A | 1/1997 | Parasin |
| 5,619,471 A | 4/1997 | Nunziata |
| 5,745,732 A * | 4/1998 | Cherukuri et al. .......... 711/168 |
| 5,847,998 A | 12/1998 | Van Buskirk |
| 5,856,947 A | 1/1999 | Fang |
| 5,925,118 A | 7/1999 | Revilla et al. |
| 5,991,223 A | 11/1999 | Kozaru et al. |
| 6,038,630 A | 3/2000 | Foster et al. |
| RE36,655 E | 4/2000 | Kozaru et al. |
| 6,061,763 A | 5/2000 | Rubin et al. |
| 6,081,458 A | 6/2000 | Lattimore et al. |
| 6,084,823 A | 7/2000 | Suzuki et al. |
| 6,091,662 A | 7/2000 | Mochida |
| 6,144,604 A | 11/2000 | Haller et al. |
| 6,167,475 A | 12/2000 | Carr |
| 6,195,280 B1 | 2/2001 | Lattimore et al. |

(Continued)

OTHER PUBLICATIONS

How Memory Works, Kinston Technology.*

(Continued)

*Primary Examiner*—Khanh Dang
(74) *Attorney, Agent, or Firm*—Dorsey & Whitney, LLP

(57) ABSTRACT

A memory system and method includes a unidirectional downstream bus coupling write data from a memory controller to several memory devices, and a unidirectional upstream bus coupling read data from the memory devices to the memory controller. The memory devices each include a write buffer for storing the write data until the respective memory device is no longer busy processing read memory requests. The downstream bus may also be used for coupling memory commands and/or row and column addresses from the memory controller to the memory devices.

16 Claims, 3 Drawing Sheets

U.S. PATENT DOCUMENTS

| | | |
|---|---|---|
| 6,215,497 B1 | 4/2001 | Leung |
| 6,219,763 B1 | 4/2001 | Lentz et al. |
| 6,269,413 B1 | 7/2001 | Sherlock |
| 6,275,432 B1 | 8/2001 | Hardee |
| 6,278,644 B1 | 8/2001 | Takasugi |
| 6,282,588 B1 | 8/2001 | Yamamoto |
| 6,351,423 B2 | 2/2002 | Ooishi |
| 6,396,749 B2 | 5/2002 | Al-Shamma et al. |
| 6,442,646 B1 | 8/2002 | Tsuruta |
| 6,452,864 B1 | 9/2002 | Condemi et al. |
| 6,510,161 B2 | 1/2003 | Trevitt et al. |
| 6,515,927 B2 | 1/2003 | Trevitt et al. |
| 6,518,787 B1 | 2/2003 | Allegrucci et al. |
| 6,587,905 B1 | 7/2003 | Correale, Jr. et al. |
| 6,587,927 B2 | 7/2003 | Hotta et al. |
| 6,618,775 B1 | 9/2003 | Davis |
| 6,636,444 B2 | 10/2003 | Uchida et al. |
| 6,662,285 B1 | 12/2003 | Douglass et al. |
| 6,704,238 B2 | 3/2004 | Izutsu et al. |
| 6,717,624 B1 | 4/2004 | Kasai |
| 6,728,157 B2 | 4/2004 | Yagishita et al. |
| 2002/0023191 A1* | 2/2002 | Fudeyasu .................... 711/104 |

OTHER PUBLICATIONS

Ram Guide, Tom's Haerware, Oct. 1998.*
Meaning Behind Ram RAS and CAS, Hardware Hell.*
Ace's Guide to Memory Technology, Ace's Hardware, Jul. 2000.*
Dynamic Random Access Memory, Wikipedia.*
Definition of memory controller from PC Guide.*

* cited by examiner

MEMORY SYSTEM AND METHOD HAVING UNIDIRECTIONAL DATA BUSES

FIELD OF THE INVENTION

The present invention relates to memory systems, and more particularly, to systems and methods for coupling command, address and data signals between a memory controller and one or more memory devices.

BACKGROUND OF THE INVENTION

Computer systems use memory devices, such as dynamic random access memory ("DRAM") devices, to store data that are accessed by a processor. These DRAM devices are normally used as system memory in a computer system. In a typical computer system, the processor communicates with the system memory through a processor bus and a memory controller. The system memory is typically arranged in memory modules each having multiple memory devices, and the memory modules are coupled through a memory bus to the memory controller. The processor issues a memory request, which includes a memory command, such as a read command, and an address designating the location from which data or instructions are to be read or to which data or instructions are to be written. The memory controller uses the command and address to generate appropriate command signals as well as row and column addresses, which are applied to the system memory through the memory bus. In response to the commands and addresses, data are transferred between the system memory and the processor. The memory controller is often part of a system controller, which also includes bus bridge circuitry for coupling the processor bus to an expansion bus, such as a PCI bus.

A high data bandwidth is a desirable capability of memory systems. Generally, bandwidth limitations are not related to the memory controllers since the memory controllers sequence data to and from the system memory as fast as the memory devices allow. One approach to increasing bandwidth is to increase the speed of the memory data bus coupling the memory controller to the memory devices. However, memory devices have not been able to keep up with increases in the data bandwidth of memory controllers and memory data buses. In particular, the memory controller must schedule all memory commands to the memory devices in a manner that allows the memory devices to respond to the commands. Although these hardware limitations can be reduced to some degree through the design of the memory device, a compromise must be made because reducing the hardware limitations typically adds cost, power, and/or size to the memory devices, all of which are undesirable alternatives. While memory devices can rapidly handle "well-behaved" accesses at ever increasing rates, for example, sequel traffic to the same page of a memory device, it is much more difficult for the memory devices to resolve "badly-behaved traffic," such as accesses to different pages or banks of the memory device. As a result, the increase in memory data bus bandwidth does not result in a corresponding increase in the bandwidth of the memory system.

In addition to the limited bandwidth of memory devices, the performance of computer systems is also limited by latency problems that increase the time required to read data from memory devices. More specifically, when a memory device read command is coupled to a system memory device, such as a synchronous DRAM ("SDRAM") device, the read data cannot be output from the SDRAM device until a delay of several clock periods has occurred. Although SDRAM devices can synchronously output burst data at a high data rate, the delay in initially providing the data can significantly slow the operating speed of a computer system using such SDRAM devices. These latency issues generally cannot by alleviated to any significant extent by simply increasing the memory data bus bandwidth.

The memory latency problem is greatly exacerbated by read accesses alternating with write accesses, a situation known as "read/write turnarounds." When a memory controller issues a read command to a memory device, the memory device must couple read data from a memory array to external data bus terminals of the memory device. The read data must then be coupled through a data bus portion of the memory bus from the memory device to the memory controller. It is only then that the memory controller can couple write data to the memory device through the data bus to initiate a write memory access.

Latency problems also exist for sequentially read command directed to different pages of memory cells in memory devices. If a second read is directed to a different page, the page to which the read is directed will not be an "open" page, i.e., a row of memory cells from which data was read during the previous memory access. If the row to which the read access is directed is not already open, data cannot be coupled from a memory array to the data bus terminals of the memory device until the page has been opened. Opening the page requires the coupling of memory command and a row address and a column address from the memory controller to the memory device. In response to the read address, the memory device must equilibrate the corresponding row, turn on access transistors for that row, and allow a sense amplifier for each column to sense the voltage that a respective memory cells couples to the sense amplifier. All of this can take a considerable period of time. For this reason, a read operations from a closed page and read/write turnarounds can prevent memory devices from even coming close to achieving the data bandwidths that are possible with high speed memory controllers and memory buses.

There is therefore a need for a memory device and memory system that allows a higher data bandwidth to be achieved particularly in the presence of alternating read and write accesses.

DETAILED DESCRIPTION

Figure 1:
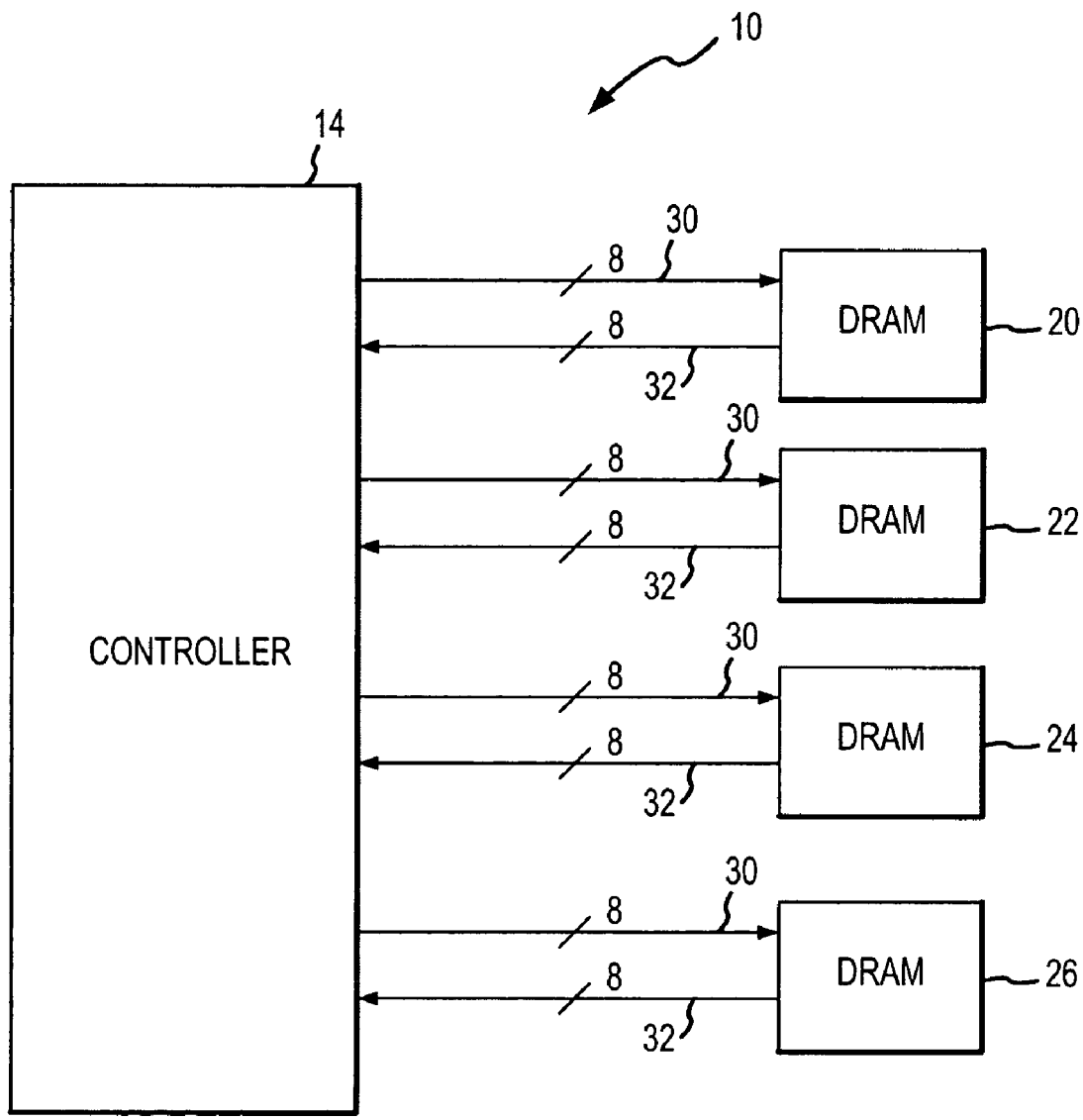
FIG. 1 is a block diagram of a memory system according to one embodiment of the invention.

A memory system 10 according to one embodiment of the invention is illustrated in FIG. 1. The memory system 10 includes a memory controller 14 coupled to the four dynamic random access memory ("DRAM") devices 20, 22, 24, 26. The memory controller 14 is coupled to each of the DRAM devices 20–26 by an 8-bit write data bus 30 and an 8-bit read data bus 32. The memory controller 14 couples memory commands and memory addresses "downstream" to the DRAM devices 20–26 through either the write data bus 30, a separate command/address bus (not shown) or separate command and address buses (not shown). If the memory commands and memory addresses are coupled through the downstream bus, the commands and addresses may be in the form of a packet, which, for write commands, may also include write data.

In operation, the memory controller 14 couples write data "downstream" to the DRAM devices 20–26 through the write data bus 30, and the DRAM devices 20–26 couple read data "upstream" to the memory controller 14 through the read data bus 32. The bandwidth of the write data bus 30 may be the same as the bandwidth of the read data bus 32. Alternatively, the write data bus 30 and the read data bus 32 may have different bandwidths to accommodate different data rates though the buses 30, 32. In the event the DRAM devices 20–26 are synchronous DRAM ("SDRAM") devices, the memory controller 14 also couples a clock signal to each of the DRAM devices 20–26. By using separate write and read data buses 30, 32, respectively, the memory controller 14 can couple write data to the DRAM devices 20–26 at the same time that the memory devices 20–26 are coupling read to the memory controller 14.

Figure 2:
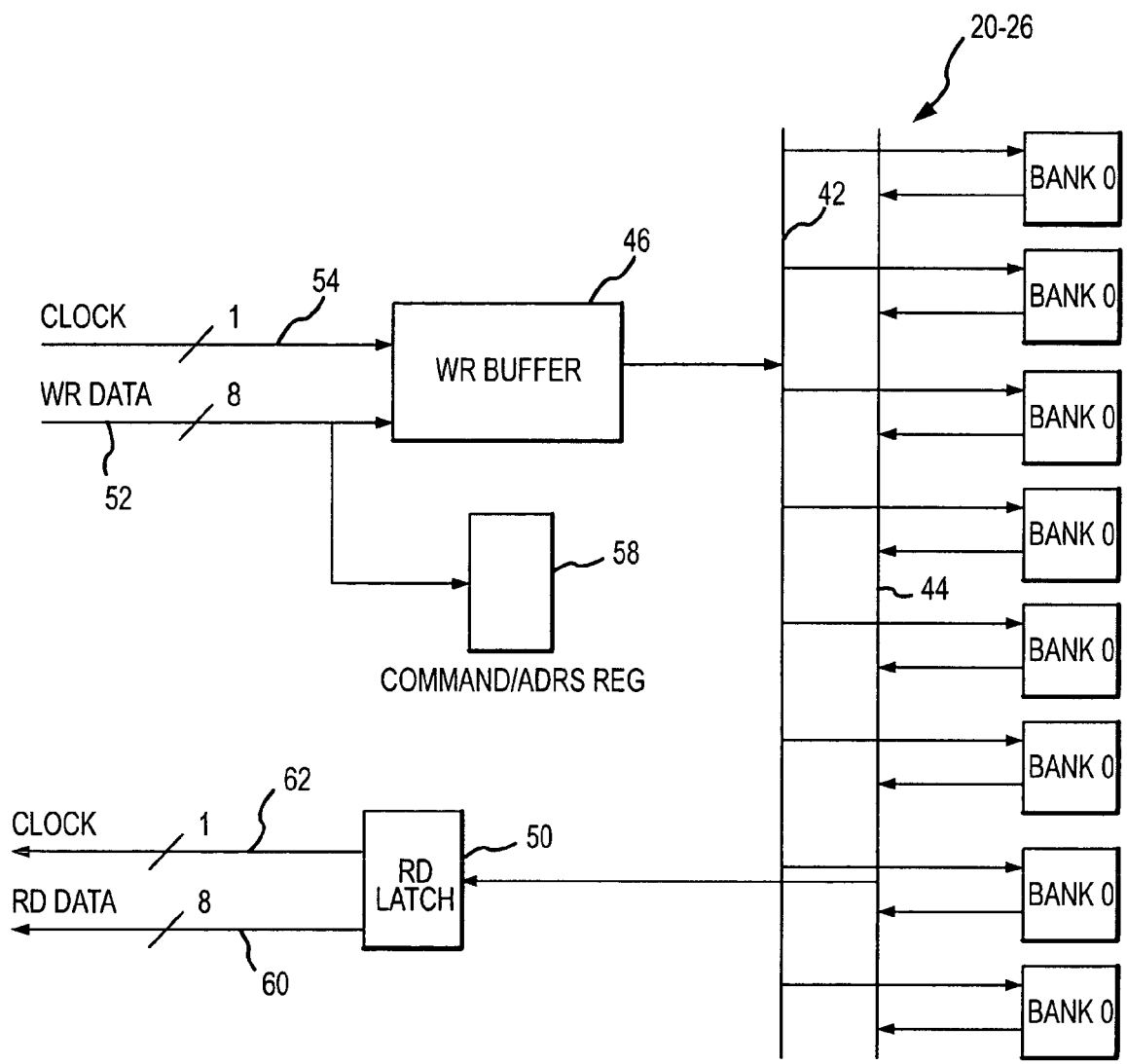
FIG. 2 is a block diagram of a dynamic random access memory devices used in the memory system of FIG. 1.

The DRAM devices 20–26 are shown in greater detail in FIG. 2. Each of the DRAM devices 20–26 includes eight memory banks 40a–h each of which are coupled to a common write data bus 42 and a common read data bus 44. The write data bus 42 receives write data from a write buffer 46, and the read data bus 44 couples read data to a read latch 50. Write data is coupled to the write buffer 46 through a write data bus 52 and is latched into the buffer 46 by a clock signal coupled through line 54. Memory commands and addresses are also coupled through the write data bus 52, and they are stored in a command/address register 58.

The read latch 50 outputs read data on an 8-bit read data bus 60 in synchronism with a clock signal that is also coupled from the read latch 50 on line 62. The memory devices 20–26 include a large number of other conventional memory device components, but these have been omitted from FIG. 2 in the interest of brevity and clarity.

In operation, memory commands, such as write commands and read commands, as well as memory addresses are coupled through the write data bus 52. The memory commands and addresses are stored in the command/address register 58. The write data also coupled through the write data bus 52 and stored in the write buffer 46. In response to a read command coupled to the command/address register 58, the memory devices 20–26 output read data, which are coupled to the read latch 50. The read latch 50 stores the read data until the read data bus 60 and memory controller 14 (FIG. 1) are able to receive the read data. The read data are then clocked out of the read latch 50 through the read data bus 60. The read memory accesses are preferably given priority over write memory accesses so that a number of write commands and associated addresses are stored in the command/address register 58 while the write data are accumulated in the write buffer 46. When a sufficient number of write accesses have been accumulated, they are processed sequentially without any intervening read accesses. As a result, the latency penalties inherent in read/write turn-arounds are avoided. Although it is not possible for write data to be coupled to one of the banks 40a–h at the same time read data is being coupled from the same bank, it is possible for write data to be coupled to one of the banks 40a–h at the same time read data is being coupled from another of the banks 40a–h. Thus, by using separate write and read data buses 30, 32, respectively, the memory controller 14 can couple write data to each of the DRAM devices 20–26 at the same time that the respective memory device 20–26 is coupling read data to the memory controller 14. By allowing a read command to be coupled through the write data bus 52 and stored in the command/address register 58, read commands can be coupled to the memory devices 20–26 during write or read operation. As a result, the latency for read operations is minimized. Otherwise, it would be necessary to wait for a write operation to be completed before a read command could be sent.

In one embodiment of the invention, the memory controller 14 (FIG. 1) simply issues read and write memory commands and addresses to the memory devices 20–26. The memory commands are stored in the command/address register 58 until the memory devices 20–26 are able to process them. The commands are then processed by each of the memory devices 20–26, and this processing includes coupling a read response or a write response to the controller through the read data bus 60. The read responses and write responses indicate to the memory controller 14 that processing of a corresponding memory request has been completed. The responses uniquely identify the memory request corresponding to the response so that it is not necessary for the memory controller 14 to keep track of the memory requests, and the memory requests may be processed out-of-order. In the case of a read response, the read response may also include the read data resulting from the corresponding read request.

Figure 3:
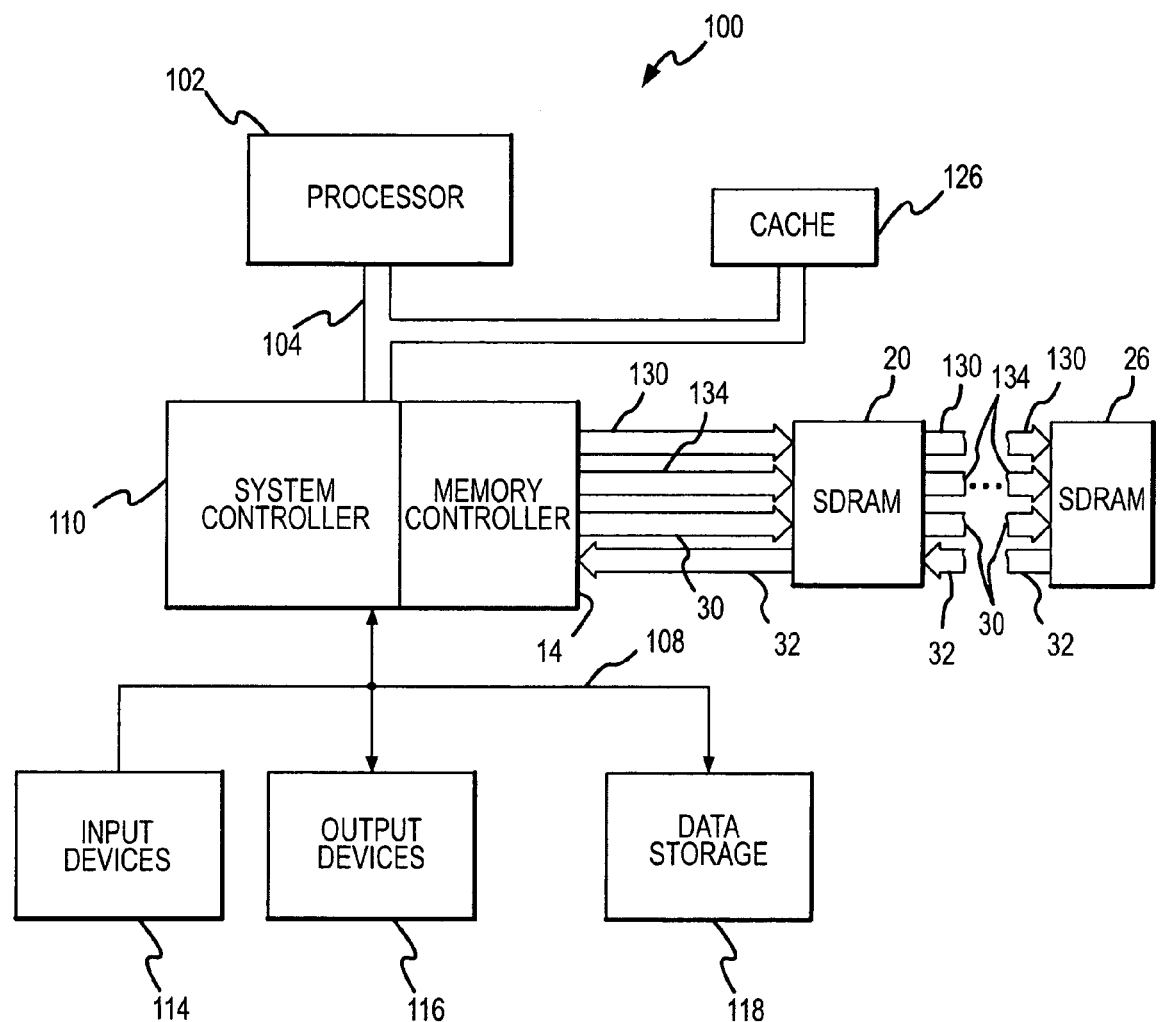
FIG. 3 is a block diagram of a computer system using the memory system of FIG. 1.

A computer system 100 using the memory system 10 of FIG. 1 is shown in FIG. 3. The computer system 100 includes a processor 102 for performing various computing functions, such as executing specific software for performing specific calculations or tasks. The processor 102 includes a processor bus 104 that normally includes an address bus, a control bus, and a data bus. The processor buss is coupled to an expansion bus 108, such as a peripheral component interconnect ("PCI") bus, through a system controller 110. The computer system 100 includes one or more input devices 114, such as a keyboard or a mouse, coupled to the processor 102 through the expansion bus 108, system controller 110 and processor bus 104 to allow an operator to interface with the computer system 100. Typically, the computer system 100 also includes one or more output devices 116 coupled to the expansion bus 108, such output devices typically being a printer or a video terminal. One or more mass data storage devices 118 are also typically coupled to the expansion bus 108 to store data or retrieve data from external storage media (not shown). Examples of typical mass data storage devices 118 include hard and floppy disks, tape cassettes, and compact disk read-only memories (CD-ROMs). The processor 102 is also typically coupled to a cache memory 126, which is usually static random access memory ("SRAM"). As mentioned above, the computer system 100 also includes the memory system 10 of FIG. 1. Specifically, the system controller 110 includes the memory controller 14, which, as explained above with reference to FIG. 1, is coupled to several DRAM devices 20–26. The memory controller 14 is coupled to each of the DRAM devices 20–26 through the write data bus 30 and the read data bus 32 as well as a command bus 130 and an address bus 134.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

I claim:

1. A memory system, comprising:
   a memory controller having a plurality of output terminals and a plurality of data input terminals,
   at least one memory device having a plurality of data output terminals and a plurality of input terminals;
   a unidirectional downstream bus coupling the output terminals of the memory controller to the input terminals of the memory device, the downstream bus being isolated from the data input terminals of the memory controller and the data output terminals of the memory device; and
   a unidirectional upstream bus coupling the data output terminals of the memory device to the data input terminals of the memory controller, the upstream bus being isolated from the output terminals of the memory controller and the input terminals of the memory device.

2. The memory system of claim 1 wherein the memory device further comprises a write buffer coupled to the input terminals of the memory device, the write buffer being operable to store write data from at least one write request and to couple the write data from the write buffer for storage in the memory device when the memory device is not processing a read request.

3. The memory system of claim 2 wherein the memory controller is operable to output a predetermined memory command when the memory device is not processing a read request, the predetermined memory command being coupled to the input terminals of the memory device through the downstream bus, and wherein the memory device is operable to couple the write data from the write buffer for storage in the memory device responsive to the predetermined memory command.

4. The memory system of claim 3 wherein the predetermined command comprises a column address strobe command.

5. The memory system of claim 1 wherein the memory controller further is further operable to couple memory commands and row and column addresses to the output terminals of the memory controller, the memory commands and row and column addresses being coupled to the memory device through the downstream bus.

6. The memory system of claim 5 wherein the memory device further comprises a command/address register coupled to the input terminals of the memory device, the command/address register being operable to store the memory commands and the row and column addresses coupled to the memory device through the downstream bus.

7. The memory system of claim 1 wherein the memory device comprises a dynamic random access memory device.

8. The memory system of claim 7 wherein the memory controller is further operable to output a clock signal, and the memory device comprises a synchronous dynamic random access memory device and includes a clock input terminal, the memory system further comprising a clock signal line coupling the clock signal from the memory controller to the clock input of the memory device.

9. A computer system, comprising:
   a processor having a processor bus;
   an input device coupled to the processor through the processor bus to allow data to be entered into the computer system;
   an output device coupled to the processor through the processor bus to allow data to be output from the computer system;
   a mass data storage device coupled to the processor through the processor bus to allow data to be read from the mass storage device;
   a memory controller coupled to the processor through the processor bus, the memory controller having a plurality of memory device output terminals and a plurality of memory device data input terminals;
   at least one memory device having a plurality of dam output terminals and a plurality of input terminals;
   a unidirectional downstream bus coupling the memory device output terminals of the memory controller to the input terminals of the memory device, the downstream bus being isolated from the memory device data input terminals of the memory controller and the data output terminals of the memory device; and
   a unidirectional upstream bus coupling the data output terminals of the memory device to the memory device data input terminals of the memory controller, the upstream bus being isolated from the memory device output terminals of the memory controller and the input terminals of the memory device.

10. The computer system of claim 9 wherein the memory device further comprises a write buffer coupled to the input terminals of the memory device, the write buffer being operable to store write data from at least one write request and to couple the write data from the write buffer for storage in the memory device when the memory device is not processing a read request.

11. The computer system of claim 10 wherein the memory controller is operable to output a predetermined memory command when the memory device is not processing a read request, the predetermined memory command being coupled to the input terminals of the memory device through the downstream bus, and wherein the memory device is operable to couple the write data from the write buffer for storage in the memory device responsive to the predetermined memory command.

12. The computer system of claim 11 wherein the predetermined command comprises a column address strobe command.

13. The computer system of claim 9 wherein the memory controller further is further operable to couple memory commands and row and column addresses to the output terminals of the memory controller, the memory commands and row and column addresses being coupled to the memory device through the downstream bus.

14. The computer system of claim 13 wherein the memory device further comprises a command/address register coupled to the input terminals of the memory device, the command/address register being operable to store the memory commands and the row and column addresses coupled to the memory device through the downstream bus.

15. The computer system of claim 9 wherein the memory device comprises a dynamic random access memory device.

16. The computer system of claim 15 wherein the memory controller is further operable to output a clock signal, and the memory device comprises a synchronous dynamic random access memory device and includes a clock input terminal, the memory system further comprising a clock signal line coupling the clock signal from the memory controller to the clock input of the memory device.

* * * * *

UNITED STATES PATENT AND TRADEMARK OFFICE
CERTIFICATE OF CORRECTION

PATENT NO.        : 7,200,693 B2
APPLICATION NO. : 10/928411
DATED             : April 3, 2007
INVENTOR(S)       : Joseph M. Jeddeloh It is certified that error appears in the above-identified patent and that said Letters Patent is hereby corrected as shown below:

| | Reads | Should Read |
|---|---|---|
| Front page: U.S. Patent Documents, Left Column | "Kumahara et al." | --Kumahara et al. ....364/200-- |
| | "Krygowski et al." | --Krygowski et al. ....364/200-- |
| | "Henderson et al." | --Henderson et al. ....364/200-- |
| | "Kumanoya et al." | --Kumanoya et al. ....365/207-- |
| | "Francisco" | --Francisco ............364/478-- |
| | "Glider et al." | --Glider et al. .......365/230.02-- |
| | "Chan" | --Chan ..................395/250-- |
| | "Konishi" | --Konishi ...........365/230.03-- |
| | "Ohba" | --Ohba ...............365/230.03-- |
| | "Konishi et al." | --Konishi et al.   365/230.03-- |

| | Reads | Should Read |
|---|---|---|
| Front page: U.S. Patent Documents, Right Column | "Iwamoto et al." | --Iwamoto et al. ........365/233-- |
| | "Kozaru et al." | --Kozaru et al. ......365/189.05-- |
| | "Parasin" | --Parasin ................220/4.28-- |
| | "Nunziata" | --Nunziata ...........365/230.03-- |
| | "Van Buskirk" | --Van Buskirk ......365/185.33-- |
| | "Fang" | --Fang ...............365/189.01-- |
| | "Revilla et al." | --Revilla et al. .........710/110-- |
| | "Kozaru et al." | --Kozaru et al. ......365/230.03-- |
| | "Foster et al." | --Foster et al. ...........710/132-- |
| | "Kozaru et al." | --Kozaru et al. ......365/189.05-- |
| | "Rubin et al." | --Rubin et al. ............711/129-- |
| | "Lattimore et al." | --Lattimore et al. ....365/189.01-- |
| | "Suzuki et al." | --Suzuki et al. ..........365/233-- |

CERTIFICATE OF CORRECTION (continued)

U.S. Pat. No. 7,200,693 B2

| | | |
|---|---|---|
| | "Mochida" | --Mochida .............365/233-- |
| | "Haller et al." | --Haller et al. ..........365/221 -- |
| | "Carr" | --Carr ...................710/113-- |
| | "Lattimore et al." | --Lattimore et al. ......365/63-- |
| Second page: U.S. Patent Documents, Left Column | Reads<br>"Leung" | Should Read<br>--Leung .....................345/419-- |
| | "Lentz et al." | --Lentz et al. ..............711/151-- |
| | "Sherlock" | --Sherlock .................710/52-- |
| | "Hardee" | --Hardee ..................365/205-- |
| | "Takasugi" | --Takasugi .................365/221-- |
| | "Yamamoto" | --Yamamoto ..............710/27-- |
| | "Ooishi" | --Ooishi .....................365/207-- |
| | "Al-Shamma et al." | --Al-Shamma et al. .....365/200-- |
| | "Tsuruta" | --Tsuruth ....................711/109-- |
| | "Condemi et al." | --Condemi et al. ..........365/233-- |
| | "Trevitt et al." | --Trevitt et al. .............370/412-- |
| | "6,515,927 B2 1/2003 Trevitt et al." | --6,515,927 B2 2/2003 Kitamoto et al. .....365/205-- |
| | "Allegrucci et al." | --Allegrucci et al. .......326/38-- |
| | "Correale, Jr. et al." | --Correale, Jr. et al. ...710/107-- |
| Second page: U.S. Patent Documents, Left Column | Reads<br>"Leung" | Should Read<br>--Leung .....................345/419-- |
| | "Lentz et al." | --Lentz et al. ............711/151-- |
| | "Sherlock" | --Sherlock ...............710/52-- |
| | "Hardee" | --Hardee ..................365/205-- |
| | "Takasugi" | --Takasugi .............365/221-- |
| | "Yamamoto" | --Yamamoto ............710/27-- |
| Second page: Other Publications, Right Column | Reads<br>"Ram Guide, Tom's Haerware, Oct. 1998." | Should Read<br>--Ram Guide, Tom's Hardware, Oct. 1998.-- |

CERTIFICATE OF CORRECTION (continued)
U.S. Pat. No. 7,200,693 B2

Drawing Sheet 2, Figure 2: Reference numeral 40a-h should be added to reflect the eight memory banks, labeled "Bank 0".

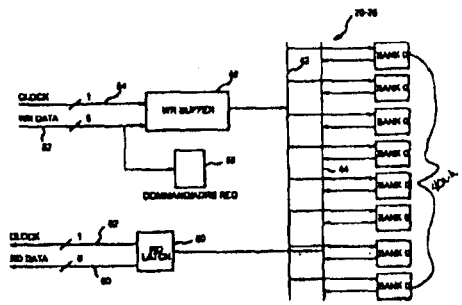

FIG.2

| Column, Line | Reads | Should Read |
| --- | --- | --- |
| Column 2, Line 33 | "memory cells couples" | --memory cell couples-- |
| Column 2, Line 34 | "For this reason, a read" | --For this reason, read-- |
| Column 2, Line 50 | "memory devices used" | --memory device used-- |
| Column 3, Line 11 | "data rates though" | --data rates through-- |
| Column 4, Line 33 | "The processor buss" | --The processor bus-- |
| Column 5, Line 4 | "data input terminals," | --data input terminals;-- |
| Column 5, Line 39 | "controller further is further" | --controller is further-- |
| Column 6, Line 8 | "plurality of dam" | --plurality of data-- |
| Column 6, Line 44 | "controller further is further" | --controller is further-- |

Signed and Sealed this

Second Day of March, 2010

David J. Kappos
*Director of the United States Patent and Trademark Office*